(12) United States Patent
Bonaccio et al.

(10) Patent No.: US 7,272,196 B2
(45) Date of Patent: Sep. 18, 2007

(54) ADJUSTABLE PHASE CONTROLLED CLOCK AND DATA RECOVERY CIRCUIT

(75) Inventors: Anthony R Bonaccio, Shelburne, VT (US); Charles J Masenas, Essex Junction, VT (US); Troy A Seman, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 778 days.

(21) Appl. No.: 10/604,177

(22) Filed: Jun. 30, 2003

(65) Prior Publication Data

US 2004/0264619 A1    Dec. 30, 2004

(51) Int. Cl.
*H04L 27/14* (2006.01)
(52) U.S. Cl. .................................. 375/326; 375/373
(58) Field of Classification Search ............... 375/326, 375/327, 371, 373
See application file for complete search history.

(56) References Cited

U.S. PATENT DOCUMENTS

| | | | | |
|---|---|---|---|---|
| 5,119,399 A | * | 6/1992 | Santos et al. | 375/224 |
| 6,097,768 A | * | 8/2000 | Janesch et al. | 375/330 |
| 6,211,741 B1 | * | 4/2001 | Dalmia | 331/11 |
| 6,480,049 B2 | * | 11/2002 | Boerstler et al. | 327/299 |

* cited by examiner

Primary Examiner—Kevin Kim
(74) Attorney, Agent, or Firm—Schmeiser, Olsen & Watts; Anthony J. Canale

(57) ABSTRACT

A clock and data recovery circuit including: means for generating a first and a second clock signal; means for receiving the first clock signal and for generating a third clock signal from the first clock signal and means for receiving the second clock signal and for generating a fourth clock signal, wherein at least one of the third and the fourth clock signals differ in phase from the first and the second clock signal respectively; means for receiving the third and fourth clock signals and a serial data stream and for generating a reconstructed serial data stream and a phase error signal; means for receiving the phase error signal and for generating a phase adjustment signal and means for receiving the phase adjustment signal by the by the clock generation circuit in a feedback loop to adjust the phases of the first and second clock signals.

24 Claims, 7 Drawing Sheets

ADJUSTABLE PHASE CONTROLLED CLOCK AND DATA RECOVERY CIRCUIT

BACKGROUND OF INVENTION

1. Field of the Invention

The present invention relates to the field of data communications circuits; more specifically, it relates to a clock and data recovery circuit and a phase adjustable clock circuit.

2. Background of the Invention

In clock and data recovery circuits (CDRs) for data communication streams operating at very high speeds clock signal noise and other circuit induced noise can result in increased data bit error rates. Examples of bit errors include zeros being reconstructed as ones and ones being reconstructed as zeros.

SUMMARY OF INVENTION

A first aspect of the present invention is a phase adjustable clock circuit comprising: means for generating a first and a second clock signal; and means for adjusting the phase of the first and second clock signals.

A second aspect of the present invention is a phase adjustable clock circuit comprising: means for generating a first clock signal and a second clock signal; and means for receiving the first clock signal and for generating a third clock signal from the first clock signal and means for receiving the second clock signal and for generating a fourth clock signal, wherein at least one of the third and the fourth clock signals differ in phase from the first and the second clock signal respectively.

A third aspect of the present invention is a clock and data recovery circuit comprising: means for generating a first and a second clock signal; means for receiving the first clock signal and for generating a third clock signal from the first clock signal and means for receiving the second clock signal and for generating a fourth clock signal, wherein at least one of the third and the fourth clock signals differ in phase from the first and the second clock signal respectively; means for receiving the third and fourth clock signals and a serial data stream and for generating a reconstructed serial data stream and a phase error signal; means for receiving the phase error signal and for generating a phase adjustment signal and means for receiving the phase adjustment signal by the clock generation circuit in a feedback loop to adjust the phases of the first and second clock signals.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION

Figure 1:
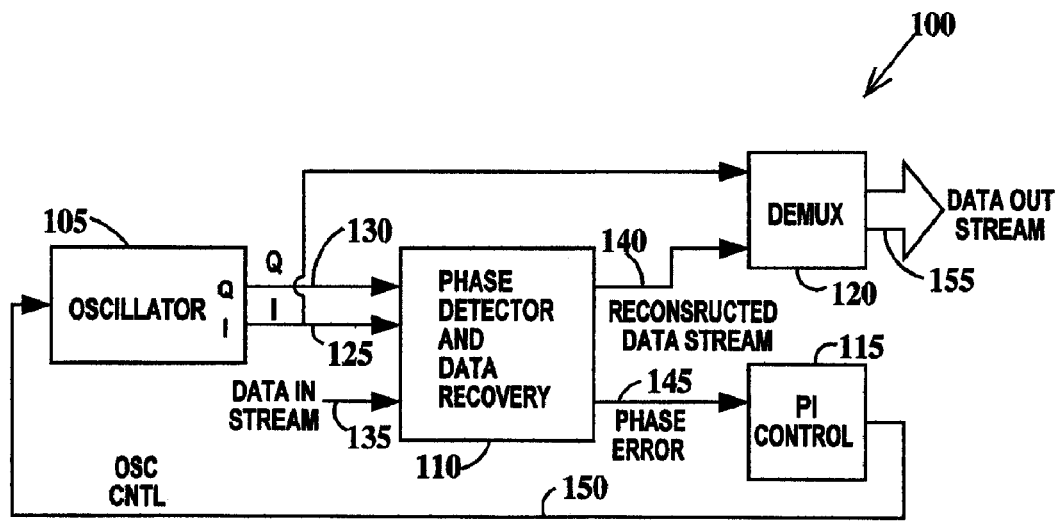
FIG. 1 is a related art data and clock recovery circuit.

FIG. 1 is a related art data and clock recovery circuit. In FIG. 1, a CDR circuit 100 includes an oscillator 105, a phase detector and data recovery circuit 110, a proportional/integral (PI) circuit 115 and a de-multiplexer 120. Oscillator 105 produces an in-phase clock signal I (hereafter I-clock) 125 and a quadrature-phase clock signal Q (hereafter Q-clock) 130 respectively at first and second outputs of the oscillator. I-clock 125 is connected to a first input of phase detector and data recovery circuit 110 and Q-clock 130 is connected to a second input of phase detector and data recovery circuit 110 and to a first input of de-multiplexer 120. A serial input data stream 135 is connected to a third input of phase detector and data recovery circuit 110. Phase detector and data recovery circuit 110 produces a reconstructed serial data stream 140 which is connected to a second input of de-multiplexer 120 and a phase error signal 145 which is connected to an input of PI control circuit 115. Phase error signal 145 describes the phase error between input data stream 135 and Q-clock 130. PI circuit 115 produces an oscillator control signal 150, which is connected to an input of oscillator 105. Oscillator control signal 150 is used to adjust I-clock 125 and Q-clock 130 relative to the phase and frequency of input data stream 135. The output of de-multiplexer 100 is a parallel data out stream 155.

Reconstructed data stream 140 is synchronized with I-clock 125 and Q-clock 130 by phase detector and data recovery circuit 110. De-multiplexer 120 converts reconstructed serial data stream 140 from a serial data stream to a parallel data stream at 1/n of the input data stream frequency, where n is the width of the data out bus.

I-clock 125 and Q-clock 130 are differential signals. Data in stream 135, data out stream 140, phase error signal 145 oscillator control signal 150 and data out stream 155 may be differential or single ended.

Figure 2:
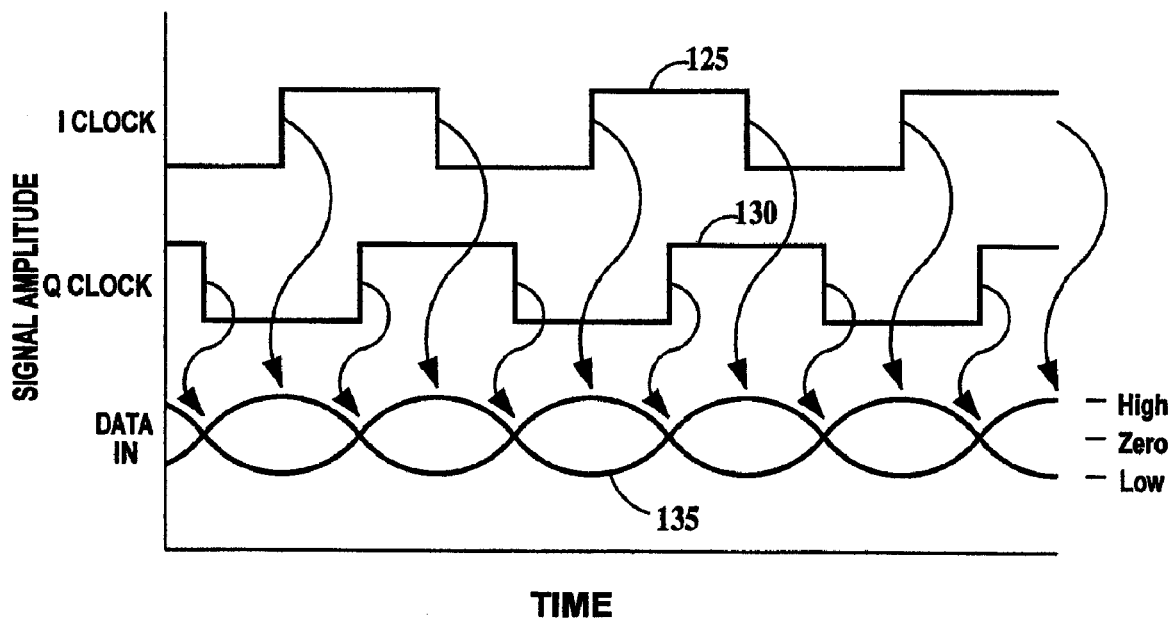
FIG. 2 is a set of timing diagrams for the circuit of FIG. 1.

FIG. 2 is a set of timing diagrams for the circuit of FIG. 1. In FIG. 2, I-clock 125 and Q-clock 130 are offset by 90 degrees, the Q-clock lagging the I-clock by 90 degrees. Since both I-clock 125 and Q-clock 130 are ntial signals, I-clock 125 contains clock pulses at 0 and 180 degrees and Q-clock 130 contains clock pulses at 90 and 270 degrees. These conditions define a quadrature phase clock system. Only the 0 degree I-clock and 90 degree Q-clock are illustrated in FIG. 2.

The edges of I-clock 125 are nominally aligned with the high/low of data in stream 135 usually half way between zero transitions, called the center of the eye, and the edges of Q-clock are nominally aligned with the zero transitions of data in stream 135.

CDR circuit 100 (see FIG. 1) is susceptible to the "eye" of data in stream not being symmetrical or the CDR circuit itself (especially phase detector and data recovery circuit) introducing a static phase offset either of which may increase the bit error rate of data out stream 155. Additionally, the center of the eye may not be the optimal point for alignment of the edge of I-clock 125 to produce the minimum bit error rate in data out stream 155. The circuit illustrated in FIG. 3 and described infra corrects the shortcomings of CDR circuit 100 (see FIG. 1) and reduce the bit error rate to a minimum.

Figure 3:
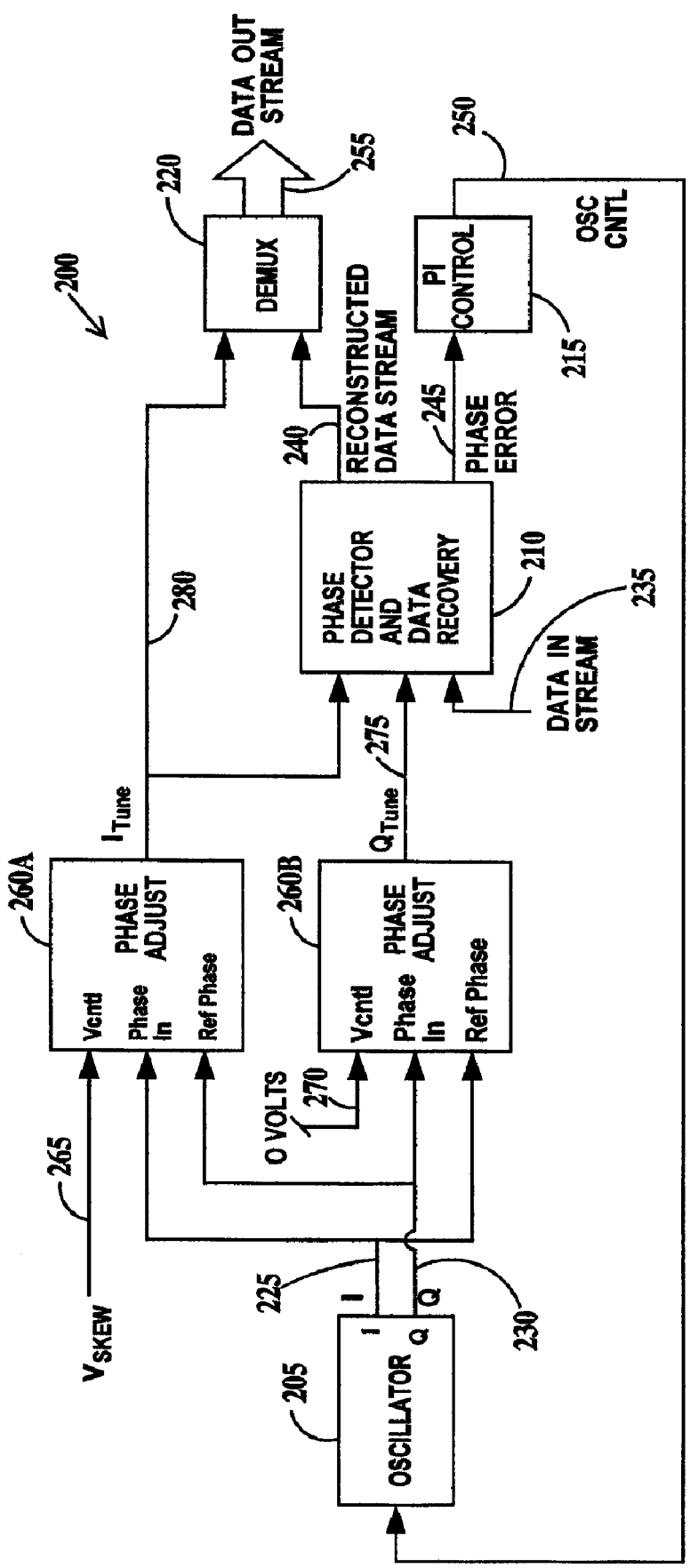
FIG. 3 is a block schematic circuit diagram of a data and clock recovery circuit according to a first embodiment of the present invention.

FIG. 3 is a block schematic circuit diagram of a data and clock recovery circuit according to a first embodiment of the present invention. In FIG. 2, a CDR circuit 200 includes an oscillator 205 (an example of a clock signal generation circuit), a phase detector and data recovery circuit 210, a proportional/integral (PI) circuit 215, a de-multiplexer 220 and first and second phase adjustment circuits 260A and 260B, each having a voltage control input, a phase in input and a reference phase input. Examples of phase detector and data recovery circuits include Alexander, Hogge and EXOR detectors and examples of PI control circuits include first order high-pass RC filters and resistor-less arrangements typically employing integral and proportional charge pumps. Phase input receives 0 and 180 degree phase clocks and reference phase input receives 90 and 270 degree phase clocks. Oscillator 205 produces an in-phase clock signal I (hereafter I-clock) 225 and a quadrature-phase clock signal Q (hereafter Q-clock) 230 respectively at first and second outputs of the oscillator. I-clock 225 is connected to the phase in input of phase adjust circuit 260A and the reference phase in input of phase adjustment circuit 260B. Q-clock 230 is connected to the reference phase input of phase adjustment circuit 260A and the phase in input of phase adjustment circuit 260B. A $V_{SKEW}$ signal 265 is connected to the voltage control inputs of phase adjustment circuits 260A. A zero volt reference voltage 270 is connected to the voltage control input of phase adjustment circuit 260B. Phase adjustment circuit 260B produces a quadrature-phase tuned clock signal (hereafter $Q_{TUNE}$ clock) 275, which is connected to a first input of phase detector and data recovery circuit 210. Phase adjustment circuit 260A produces an in-phase tuned clock signal (hereafter $I_{TUNE}$ clock) 280, which is connected to a first input of de-multiplexer 220 and to a second input of phase detector and data recovery circuit 210. A serial input data stream 235 is connected to a third input of phase detector and data recovery circuit 210. Phase detector and data recovery circuit 210 produces a reconstructed serial data stream 240 which is connected to a second input of de-multiplexer 220 and a phase error signal 245 which is connected to an input of PI control circuit 215. Phase error signal 245 describes the phase error between input data stream 235 and Q-clock 230. PI circuit 215 produces an oscillator control signal 250, which is connected to an input of oscillator 205. Oscillator control signal 250 is used to adjust I-clock 225 and Q-clock 230 relative to the phase of input data stream 235. The output of de-multiplexer 200 is a parallel data out stream 255.

Figure 4:
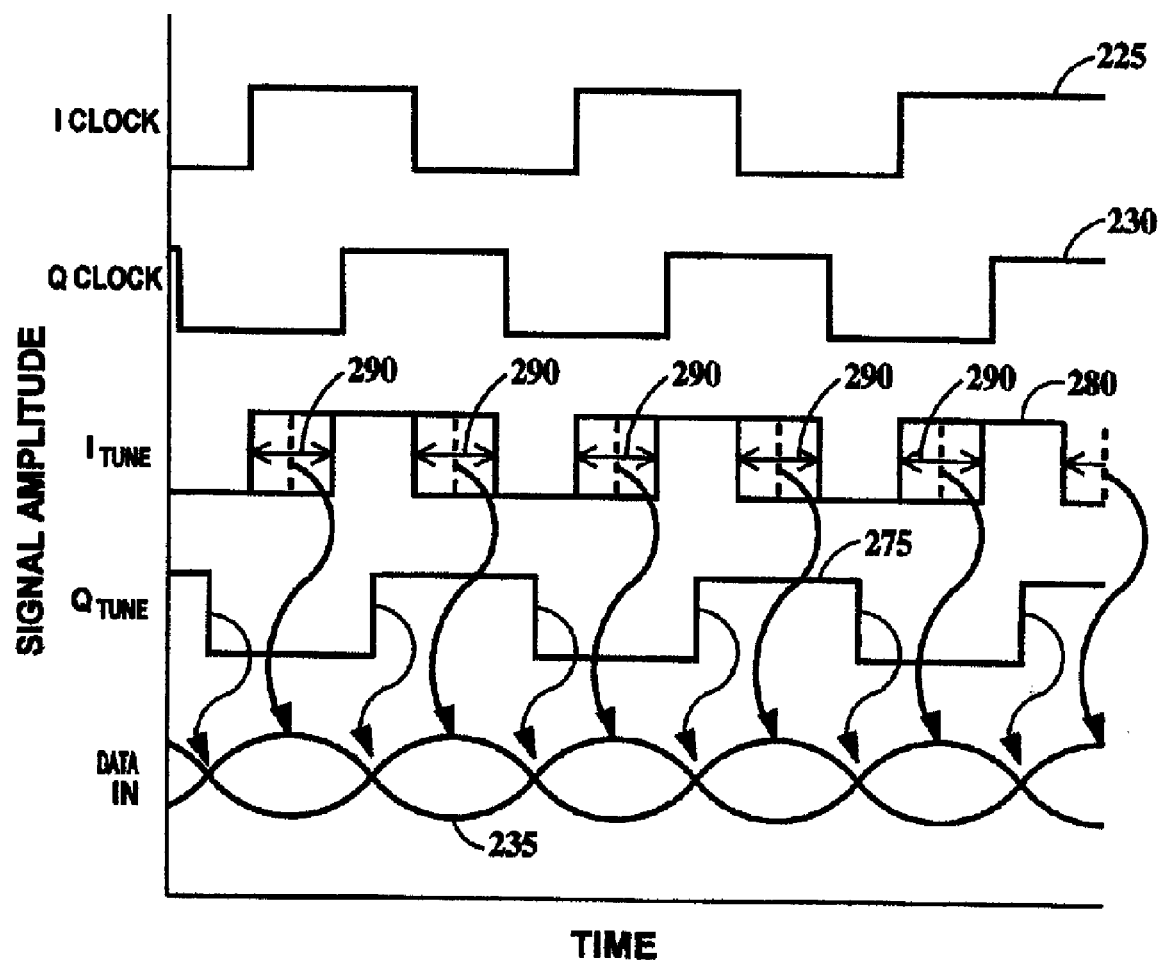
FIG. 4 is a set of timing diagrams for the circuit of FIG. 3.

Reconstructed data stream 240 is synchronized with $Q_{TUNE}$ clock 275 by phase detector and data recovery circuit 210. Phase error signal 245 is the phase delta between data in stream 235 and $Q_{TUNE}$ clock 275. De-multiplexer 220 converts reconstructed serial data stream 240 from a serial data stream to a parallel data stream at 1/n of the input data stream frequency where n is the width of the data out bus. Phase adjustment circuit 260A moves the edges $I_{TUNE}$ clock 280 through a phase range controlled by $V_{SKEW}$ 265 as illustrated in FIG. 4 and described infra. By monitoring the bit rate error of data output stream 255, as the value of $V_{SKEW}$ signal 265 is changed, the value of $V_{SKEW}$ signal 265 that produces the minimum bit error rate may be determined.

I-clock 225, Q-clock 230, $I_{TUNE}$ clock 280 and $Q_{TUNE}$ clock 275 are differential signals. Data in stream 235, reconstructed data stream 240, phase error signal 245 oscillator control signal 250 and data out stream 255 may be differential or single ended.

FIG. 4 is a set of timing diagrams for the circuit of FIG. 3. In FIG. 4, I-clock 225 and Q-clock 230 are offset by 90 degrees, the Q-clock lagging the I-clock by 90 degrees. Since both I-clock 225 and Q-clock 230 are differential signals, I-clock 225 contains clock pulses at 0 and 180 degrees relative to rising I-clock edges and Q-clock 230 contains clock pulses at 90 and 270 degrees. Only the 0 degree I-clock and 90 degree Q-clock are illustrated in FIG. 2. $I_{TUNE}$ 275 and $Q_{TUNE}$ 280 are offset by 90 degrees, the $Q_{TUNE}$ clock lagging the $I_{TUNE}$ clock by 90 degrees. Since both $I_{TUNE}$ clock 280 and $Q_{TUNE}$ clock 275 are differential signals, $I_{TUNE}$ clock 280 contains clock pulses at 0 and 180 degrees and $Q_{TUNE}$ clock 275 contains clock pulses at 90 and 270 degrees. Only the 0 degree I-clock and 90 degree Q-clock are illustrated in FIG. 2. The edges of $I_{TUNE}$ clock 280 are moveable through a tuning range 290 controlled by $V_{SKEW}$ signal 265 (see FIG. 3). In a first mode of operation, the edges of $I_{TUNE}$ clock 280 (the dashed line represents the center of the range) are aligned via $V_{SKEW}$ signal 265 with the high/low transitions of data in stream 235. The edges of $Q_{TUNE}$ clock 275 are nominally aligned with the zero transitions of data in stream 235. In a second mode of operation, edges of $I_{TUNE}$ clock 280 are purposefully not aligned with the high or low transitions of data in stream 235 but are offset (within tuning range 290) from the high/low transitions to give the minimum bit error rate for data output stream 255 (see FIG. 3).

In one example, the bit rate is 40 GB/sec and oscillator 205 (see FIG. 3) is running at 20 GHz. The width of the data bit window is one data unit interval ($UI_{DATA}$) and for the present example is 25 ps. The period of the clock is one clock unit interval ($UI_{CLOCK}$) and for the present example is 50 ps. The tuning range 290 is +/−125 $mUI_{CLOCK}$ or +/−90 degrees. The clock phase reference in degrees or unit intervals (UI) is with respect to the half-rate clock. The data phase reference in UI units is doubled. Thus, a tuning range 290 of +/−125 $mUI_{CLOCK}$ (+/−45 degrees clock) is equivelent to +/−250 mUIDATA (+/−90 data).

Figure 5:
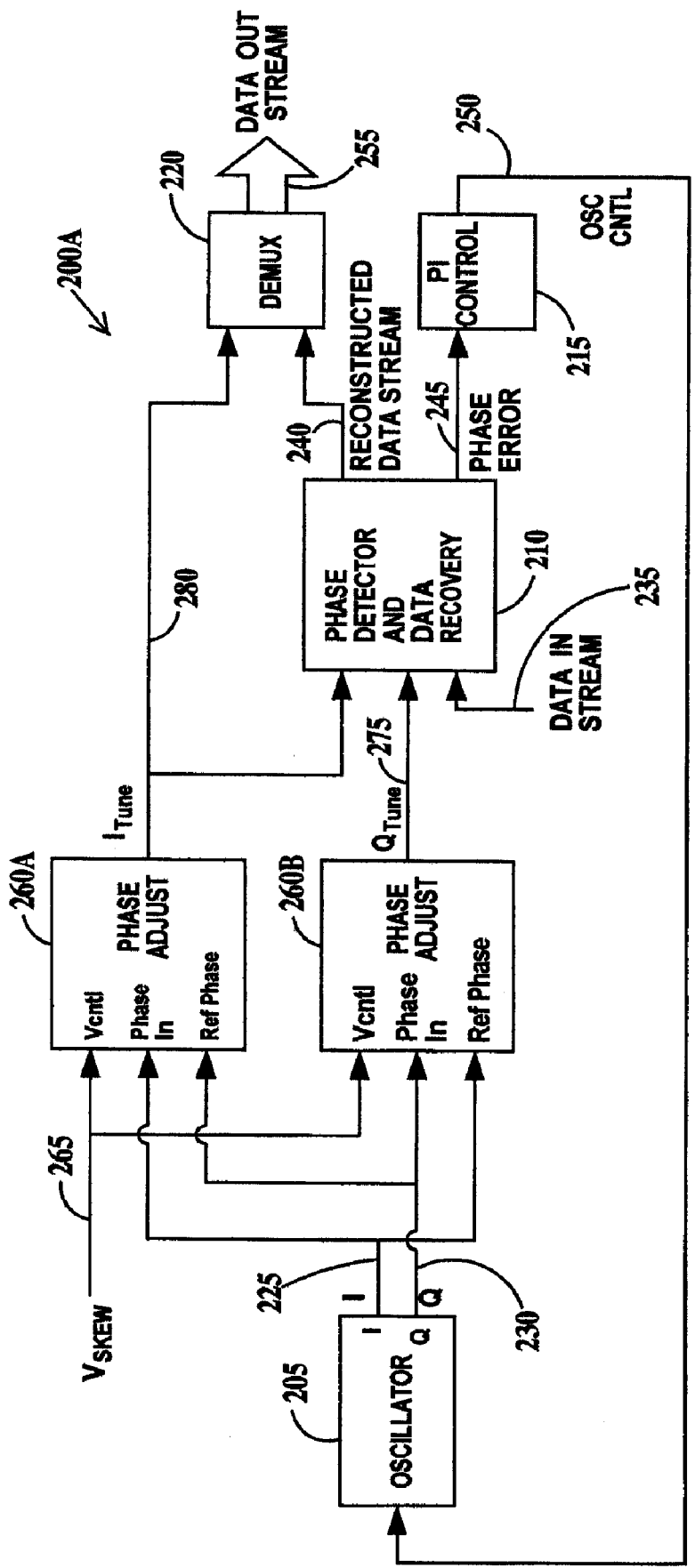
FIG. 5 is a block schematic circuit diagram of a data and clock recovery circuit according to a second embodiment of the present invention.

FIG. 5 is a block schematic circuit diagram of a data and clock recovery circuit according to a second embodiment of the present invention. In FIG. 5, a CDR circuit 200A is identical to CDR circuit 200 illustrated in FIG. 3 and described supra except that $V_{SKEW}$ clock 265 is connected to both voltage control inputs of phase adjust circuits 260A and 260B. While in clock and data recovery circuit 200 of FIG. 3, only $I_{TUNE}$ clock 280 is tunable, in clock and data recovery circuit 200A both $I_{TUNE}$ clock 280 and $Q_{TUNE}$ clock 275 are tunable as may be seen from the timing diagrams of FIG. 6.

Figure 6:
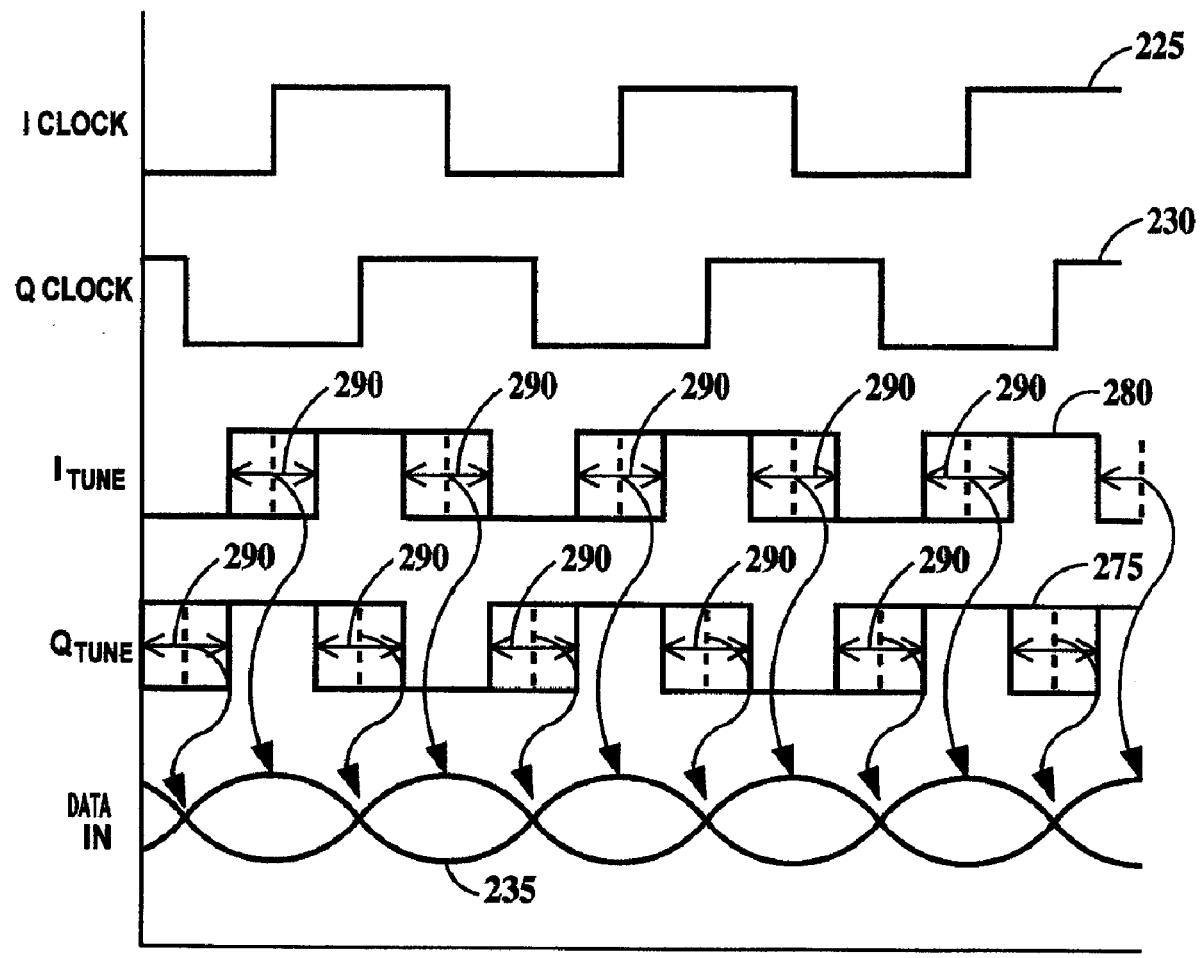
FIG. 6 is a set of timing diagrams for the circuit of FIG. 5.

FIG. 6 is a set of timing diagrams for the circuit of FIG. 5. In FIG. 6, I-clock 225, Q-clock 230, $I_{TUNE}$ clock 280, and data in stream 235 are the same as in FIG. 4. $Q_{TUNE}$ clock 275 has been modified. The edges of both $I_{TUNE}$ clock 280 and $Q_{TUNE}$ clock 275 are moveable (together) through a tuning range 290 controlled by $V_{SKEW}$ signal 265 (see FIG. 5). In a first mode of operation, the edges of $I_{TUNE}$ clock 280 (the dashed line represents the center of the range) are nominally aligned (via $V_{SKEW}$ signal 265 (see FIG. 5)) with the high/low transitions of data in stream 235 and the edges of $Q_{TUNE}$ clock 275 are nominally aligned (via $V_{SKEW}$ signal 265 (see FIG. 5)) with the zero transition of data in stream 235. In a second mode of operation, edges of $I_{TUNE}$ clock 280 and $Q_{TUNE}$ clock 275 are purposefully not aligned with the high or low transitions of data in stream 235 but are offset (within tuning range 290) from the high/low transitions and zero transition respectively to give the minimum bit error rate for data output stream 255 (see FIG. 3).

Figure 7:
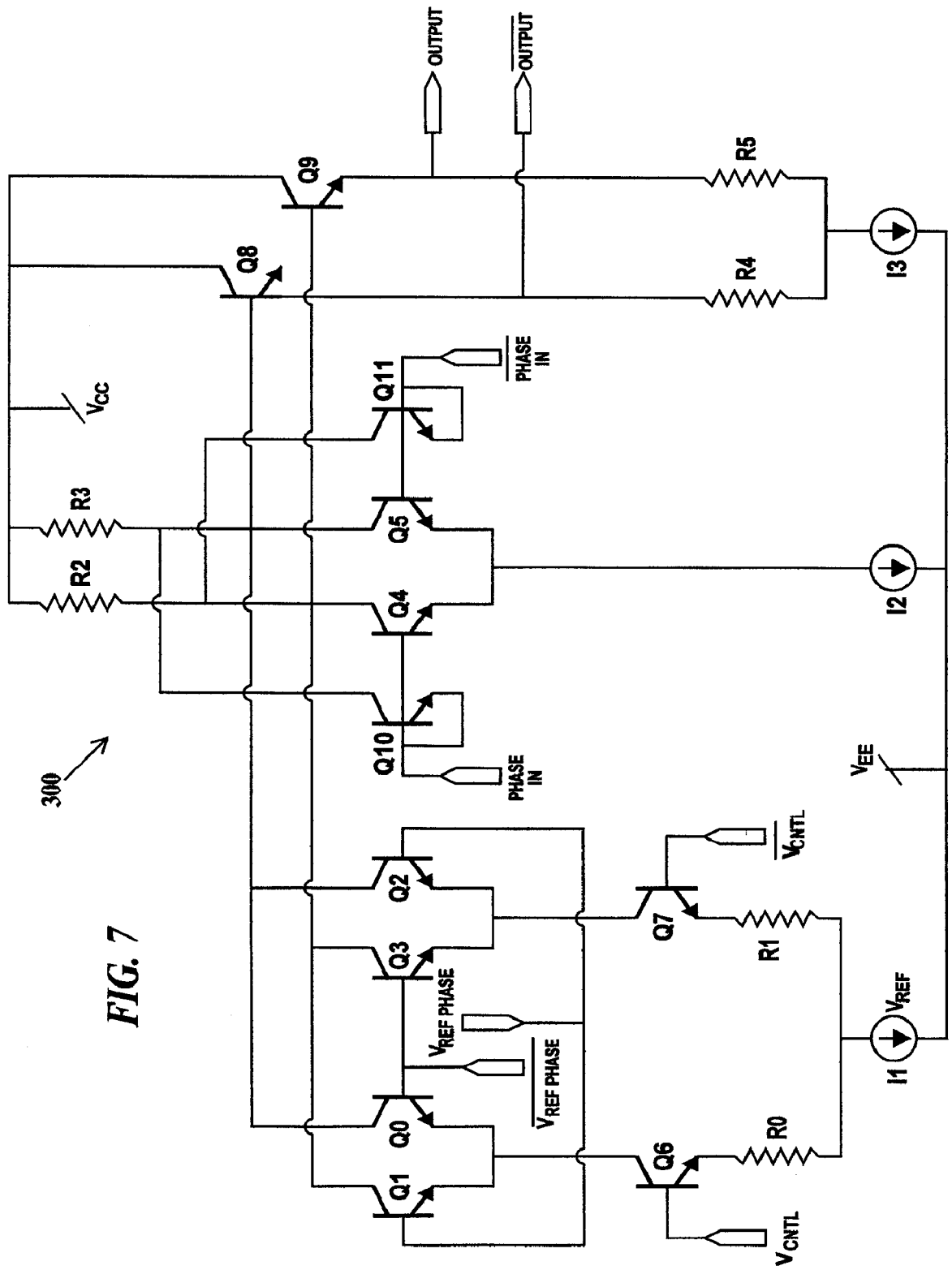
FIG. 7 is a schematic circuit diagram of a phase adjustment circuit utilized in the circuits of FIGS. 3 and 5.

FIG. 7 is a schematic circuit diagram of a circuit diagram of a phase adjustment circuit utilized in the CDR circuits of FIGS. 3 and 5. Note phase adjustment circuits 260A and 260B of FIGS. 3 and 5 respectively are identical circuits, only the signals on the in phase, reference phase and $V_{CNTL}$ inputs change. In FIG. 7, phase adjustment circuit 300 includes NPN bipolar transistors Q0, Q1, Q2, Q3, Q4, Q5, Q6, Q7, Q8, Q9, Q10 and Q11; resistors R0, R1, R2, R3, R4 and R5; and current sources I1, I2 and I3. The $V_{REF\ PHASE}$ bar input of phase adjustment circuit 300 is connected to the bases of NPN Q0 and Q3 and the $V_{REF\ PHASE}$ input of phase adjustment circuit 300 is connected to the bases of NPNs Q1 and Q2. The $V_{PHASE\ IN}$ input of phase adjustment circuit 300 is connected to the base of NPNs Q10 and Q4 and the emitter of NPN Q10. The $V_{PHASE\ IN}$ bar input of phase adjustment circuit 300 is connected to the base of NPNs Q11 and Q5 and the emitter of NPN Q11. The voltage control input ($V_{CNTL}$) of phase adjustment circuit 300 is connected to the base of NPN Q6 and the $V_{CNTL}$ bar of phase adjustment circuit 300 is connected to the base of NPN Q7. The output of phase adjustment circuit 300 ($I_{TUNE}$ clock 280 for phase adjustment circuit 260A and $Q_{TUNE}$ clock 275 for phase adjustment circuit 260B of FIGS. 3 and 5) is coupled to the base of NPN Q9 and through resistor R5 to current source I3. The output bar of phase adjustment circuit 300 ($I_{TUNE}$ clock 280 for phase adjustment circuit 260A and $Q_{TUNE}$ clock 275 for phase adjustment circuit 260B of FIGS. 3 and 5) is coupled to the base of NPN Q8 and through resistor R4 to current source I3.

The collector of NPN Q6 is connected to the emitters of NPNs Q0 and Q1 and the emitter of NPN Q6 is connected to through resistor R0 to current source I1. The collector of NPN Q7 is connected to the emitters of NPNs Q2 and Q3 and the emitter of NPN Q7 is connected to through resistor R1 to current source I1. Current source I1 is connected to $V_{EE}$. The emitters of NPNs Q4 and Q5 are connected to current source I2. Current sources I3 is connected to $V_{EE}$. The collectors of NPNs Q1 Q3 and Q4 are connected to the base of NPN Q9. The collectors of NPNs Q0, Q2, Q10, Q5 are connected to the base of NPN Q8. The collectors of NPNs Q10 and Q5 are also connected to $V_{CC}$ through resistor R3. The collectors of NPNs Q4 and Q11 are also connected to $V_{CC}$ through resistor R2. The collectors of NPNs Q8 and Q9 are connected to $V_{CC}$.

In operation, with zero volts applied to $V_{CNTL}$ and $V_{CNTL}$ bar ($V_{SKEW}$ signal 265 of FIGS. 3 and 5), the currents through NPNs Q0, Q1, Q2 and Q3 will be equal and the output current from the Q0/Q1 stage will cancel the current from the Q2/Q3 stage. Thus output and output bar will be controlled by stage Q4/Q5.

With a positive voltage applied to $V_{CNTL}$ and an equal but negative voltage applied to $V_{CNTL}$ bar, the currents in stages Q0/Q1 and Q2/Q3 will be weighted to stage Q0/Q1. The currents from the Q0/Q1 stage will sum with the current in the Q4/Q5 stage and the phase of the signal on output and output bar will be a mixture of the reference phase and the in phase input signal. If the currents in the Q0/Q1 stage and the Q4/Q5 stage are equal, the phase of the signal on output and output bar will be approximately equal between the phase of the in phase signal and the phase of the reference phase signal. The maximum resulting phase shift of the output and output bar signals is thus =/−250 mUI data (+/−90 degrees data) (i. e 0−180/2=−90 degrees or 270−90/2=90 degrees) or 125 $mUI_{CLOCK}$ from the phase of output and output bar signals that results when $V_{CNTL}$=0.

With a negative voltage applied to $V_{CNTL}$ and an equal but positive voltage applied to $V_{CNTL}$ bar, the currents in stages Q0/Q1 and Q2/Q3 will be weighted to stage Q2/Q3. The currents from the Q2/Q3 stage will sum with the current in the Q4/Q5 stage and the phase of the signal on output and output bar will be a mixture of the reference phase and the in phase input signal. If the currents in the Q0/Q1 stage and the Q4/Q5 stage are equal, the phase of the signal on output and output bar will be approximately equal between the phase of the in phase signal and the phase of the reference phase signal.

The ratio of currents through NPN Q8 and Q9 determine the amount of phase shift and is controlled by the sign and magnitude of $V_{CNTL}$ and $V_{CNTL}$ bar.

Returning to FIG. 3, $I_{TUNE}$ 280 is rotated away from I-clock 225 by an amount controlled by $V_{CNTL}$. Returning to FIG. 5, $I_{TUNE}$ 280 is rotated away from I-clock 225 by an amount controlled by $V_{CNTL}$. $Q_{TUNE}$ 275 is rotated away from Q-clock 230 (in a direction opposite to the direction of rotation of ITUNE 280) by an amount controlled by $V_{CNTL}$. In other words, $I_{TUNE}$ clock 180 is advanced and $Q_{TUNE}$ clock 275 is retarded. Thus $I_{TUNE}$ and $Q_{TUNE}$ are always 90 degrees out of phase and when $V_{CNTL}$=0, Q-clock and QTUNE are in phase.

Figure 8A:
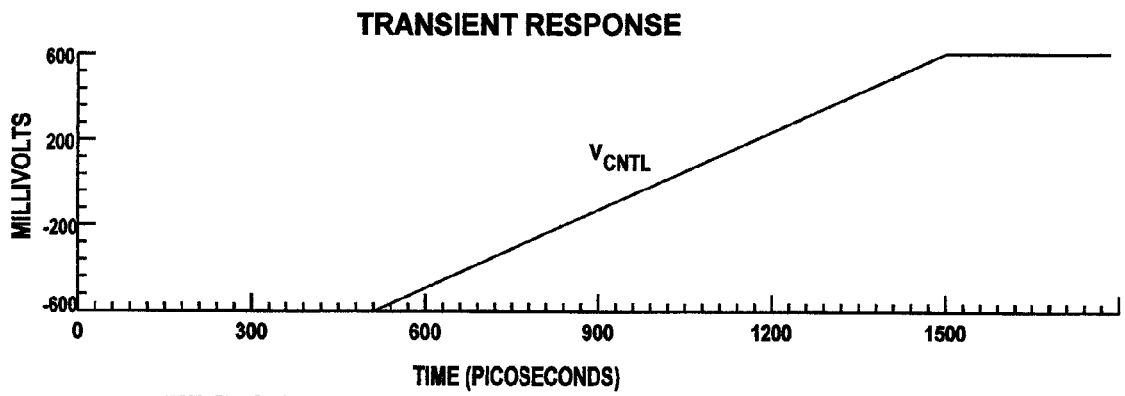
FIG. 8A is a timing diagram of transient response of the circuit of FIG. 7.

FIG. 8A is a timing diagram of transient response of the circuit of FIG. 7. In FIG. the magnitude of $V_{CNTL}$ ($V_{SKEW}$ signal 265) is plotted versus time.

Figure 8B:
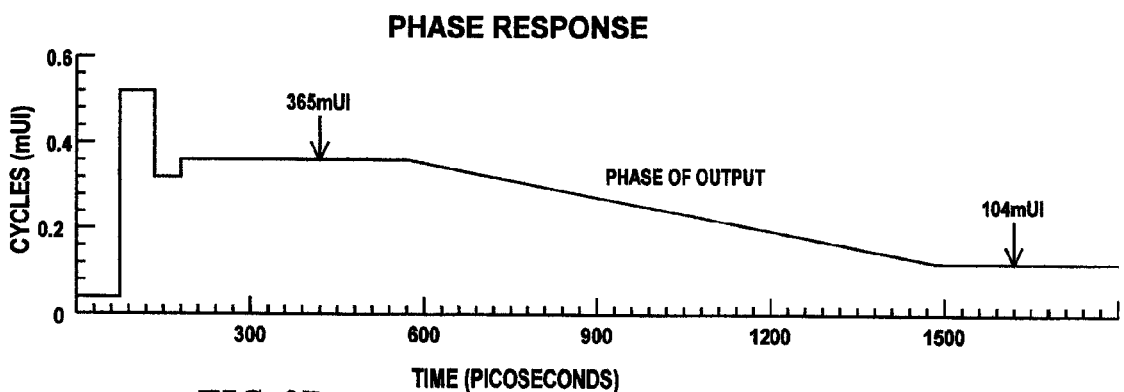
FIG. 8B is a timing diagram of the phase response of the circuit of FIG. 7.

FIG. 8B is a timing diagram of the output phase response of the circuit of FIG. 7. In FIG. 8B, the phase of output and output bar is plotted versus time. Nominal is 250 mUI with a tuning range of +/−125 mUI.

Figure 8C:
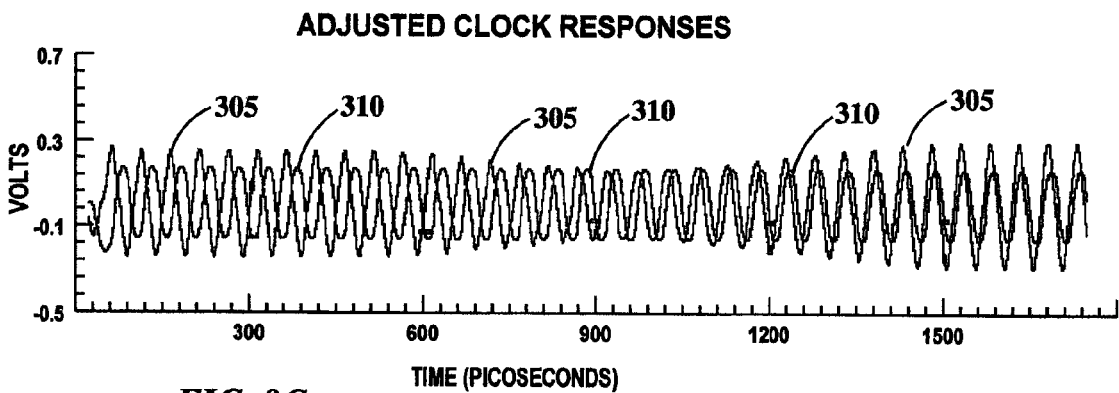
FIG. 8C is a timing diagram of the adjusted clock responses of the circuit of FIG. 7.

FIG. 8C is a timing diagram of the adjusted clock response of the circuit of FIG. 7. In FIG. 8C curve 305 is differential voltage $I_{TUNE}$ and curve 310 is differential voltage $Q_{TUNE}$.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

The invention claimed is:

1. A clock and data recovery circuit comprising:
   means for generating a first and a second clock signal;
   a first phase adjustment circuit that receives said first clock signal and that generates a third clock signal from said first clock signal and a second phase adjustment circuit that receives said second clock signal and that generates a fourth clock signal, wherein at least one of said third and said fourth clock signals differ in phase from said first and said second clock signal respectively;
   means for receiving said third and fourth clock signals and a serial data stream and for generating a reconstructed serial data stream and a phase error signal;
   means for receiving said phase error signal and for generating a phase adjustment signal and means for receiving said phase adjustment signal by said means for generating a first and a second clock signal in a feedback loop to adjust the phases of said first and second clock signals.

2. The circuit of claim 1, further including means for receiving said third clock signal and said reconstructed serial data stream and for generating a parallel data stream.

3. The circuit of claim 1, wherein the phase of said third clock signal is adjustable in a phase range centered on the high/low transition of said serial data stream.

4. The circuit of claim 3, wherein the amount of phase adjustment of said third clock signal is a function of the magnitude and polarity of a control voltage applied to said first phase adjustment circuit.

5. The circuit of claim 1, wherein the phase of said third clock signal is aligned to the zero transition of said serial data stream.

6. The circuit of claim 1, wherein the phase of said fourth clock signal is adjustable in a phase range centered on the zero transition of said serial data stream.

7. The circuit of claim 3, wherein the amount of phase adjustment of said fourth clock signal is a function of the magnitude and polarity of a control voltage applied to said second phase adjustment circuit.

8. The circuit of claim 1, wherein the phases of said first and second clock signals are 90 degrees apart.

9. The circuit of claim 1, wherein the phase of said third clock signal differs in a phase range of +/−90 degrees from the phase of said first clock signal and the phases of the second clock signal and fourth clock signals are the same.

10. The circuit of claim 9, wherein the center of the phase range of said third clock signal is offset +/−90 degrees from the phase of said fourth clock signal.

11. The circuit of claim 9, wherein the phase difference between said first clock signal and said third clock signal is a function of the magnitude and polarity of a control voltage applied to said first phase adjustment circuit.

12. The circuit of claim 1, wherein the phase of said third clock signal differs in a phase range of +/−90 degrees from the phase of said first clock signal and the phase of said fourth clock signal differs in a phase range of +/−90 degrees from the phase of said second clock signal.

13. The circuit of claim 12, wherein the center of the phase range of said third clock signal is offset +/−90 degrees from the center of the phase range of said fourth clock signal.

14. The circuit of claim 12, wherein an amount of phase difference between said first and third clock signals is the same as an amount of phase difference between said second and fourth clock signals and is a function of the magnitude and polarity of a control voltage applied to both said first and second phase adjustment circuits.

15. The circuit of claim 1, wherein said means for generating said first and second clock signals comprises an oscillator.

16. The circuit of claim 1, wherein the amount of phase adjustment of said third clock signal is a function of the magnitude and polarity of a first control signal applied to said first phase adjustment circuit and wherein the amount of phase adjustment of said fourth clock signal is a function of the magnitude and polarity of a second control signal applied to said second phase adjustment circuit.

17. The circuit of claim 16, wherein first and second control signal are differential voltage signals.

18. The circuit of claim 16, wherein said first and second control signals are the same control signal.

19. A clock and data recovery circuit, comprising:
 a clock generation circuit that generates a first and a second clock signal and that receives a feedback signal;
 a first phase adjustment circuit that receives said first and second clock signals and a first control signal and that generates a third clock signal;
 a second phase adjustment circuit that receives said first and second clock signals and a second control signal and that generates a fourth clock signal;
 a phase detector and data recovery circuit that receives said third and fourth clock signals and an input data stream and that generates a reconstructed data stream and a phase error signal;
 a proportional/integral circuit that receives said phase error signal and generates said feedback signal; and
 a de-multiplexer that receives said third clock signal and said reconstructed data stream and that generates an output data stream.

20. The circuit of claim 19, wherein said first and second control signals are the same signal.

21. The circuit of claim 19, wherein said first, second, third and fourth clock signals and said first and second control signal are differential voltage signals.

22. The circuit of claim 19, wherein said first, second, third and fourth clock signals and said first signal are differential voltage signals and said second control signal is a single voltage level signal.

23. The circuit of claim 19, wherein said input data stream is a serial data stream and said output data stream is a parallel data stream.

24. The circuit of claim 19 wherein the phases of said first and second clocks are 90 degrees apart.

* * * * *